(12) United States Patent
Lee et al.

(10) Patent No.: US 8,631,306 B2
(45) Date of Patent: Jan. 14, 2014

(54) METHOD AND MEMORY SYSTEM USING A PRIORI PROBABILITY INFORMATION TO READ STORED DATA

(75) Inventors: Ki jun Lee, Seoul (KR); Hong Rak Son, Anyang-si (KR); Jun jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 331 days.

(21) Appl. No.: 12/985,397

(22) Filed: Jan. 6, 2011

(65) Prior Publication Data

US 2011/0208897 A1     Aug. 25, 2011

(30) Foreign Application Priority Data

Feb. 25, 2010    (KR) ........................ 10-2010-0017286

(51) Int. Cl.
    *H03M 13/00*       (2006.01)
    *H03M 13/03*       (2006.01)
    *G11C 29/00*       (2006.01)

(52) U.S. Cl.
    USPC ............ 714/780; 714/773; 714/794; 714/795

(58) Field of Classification Search
    USPC .................................. 714/794, 795, 780, 773
    See application file for complete search history.

(56) References Cited

U.S. PATENT DOCUMENTS

| | | | | |
|---|---|---|---|---|
| 5,448,578 A | * | 9/1995 | Kim .............................. | 371/40.4 |
| 6,014,411 A | * | 1/2000 | Wang ............................. | 375/259 |
| 6,161,209 A | * | 12/2000 | Moher .......................... | 714/780 |
| 6,192,501 B1 | * | 2/2001 | Hladik et al. ................. | 714/786 |
| 6,222,835 B1 | * | 4/2001 | Franz et al. .................... | 370/349 |
| 6,263,467 B1 | * | 7/2001 | Hladik et al. ................. | 714/755 |
| 6,421,804 B1 | * | 7/2002 | Lee ................................ | 714/755 |
| 6,516,437 B1 | * | 2/2003 | Van Stralen et al. .......... | 714/755 |
| 7,234,096 B2 | * | 6/2007 | Yamada ........................ | 714/755 |
| 7,398,453 B2 | | 7/2008 | Yu | |
| 7,508,704 B2 | | 3/2009 | Honma et al. | |
| 8,086,580 B2 | * | 12/2011 | Sachedina et al. ............ | 707/704 |
| 2002/0174400 A1 | * | 11/2002 | Yamada ........................ | 714/786 |
| 2004/0237020 A1 | * | 11/2004 | Eiji ............................... | 714/758 |
| 2005/0275573 A1 | * | 12/2005 | Raveendran .................. | 341/120 |
| 2008/0104459 A1 | | 5/2008 | Uchikawa et al. | |
| 2009/0129169 A1 | * | 5/2009 | Roohparvar et al. ..... | 365/185.21 |
| 2009/0319873 A1 | * | 12/2009 | Doi et al. ....................... | 714/777 |
| 2010/0199149 A1 | * | 8/2010 | Weingarten et al. .......... | 714/773 |
| 2011/0225350 A1 | * | 9/2011 | Burger et al. ................. | 711/103 |

FOREIGN PATENT DOCUMENTS

| | | |
|---|---|---|
| JP | 2008016092 A | 1/2008 |
| JP | 2008108356 A | 5/2008 |
| KR | 1020080004374 A | 1/2008 |
| KR | 1020080053346 A | 6/2008 |

* cited by examiner

*Primary Examiner* — Joseph D Torres
(74) *Attorney, Agent, or Firm* — Volentine & Whitt, PLLC

(57) ABSTRACT

A memory system comprises a non-volatile memory device that stores user data and state information regarding the user data. In a read operation of the non-volatile memory device, a memory controller calculates a priori probabilities for the user data based on the state information, calculates a posteriori probabilities based on the a priori probabilities, and performs a soft-decision operation to determine values of the user data based on the a posteriori probabilities.

9 Claims, 7 Drawing Sheets

METHOD AND MEMORY SYSTEM USING A PRIORI PROBABILITY INFORMATION TO READ STORED DATA

CROSS-REFERENCE TO RELATED APPLICATIONS

This application claims priority under 35 U.S.C. §119 to Korean Patent Application No. 10-2010-0017286 filed on Feb. 25, 2010, the disclosure of which is hereby incorporated by reference in its entirety.

BACKGROUND

Embodiments of the inventive concept relate generally to semiconductor devices. More particularly, embodiments of the inventive concept relate to memory systems using a priori probability information to read stored data and methods of operating the memory systems.

Semiconductor memory devices play a significant role in a wide variety of consumer and industrial technologies, ranging from home computers to satellite equipment. Consequently, improvements in semiconductor memory technology can have a significant impact on the performance of numerous technical applications.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM), ferroelectric random access memory (FeRAM), phase-change random access memory (PRAM), and flash memory.

Flash memory has become an especially popular form of nonvolatile memory due to its relatively low cost, low power consumption, high integration density, and ability to withstand physical shock. However, as the demand for flash memory continues to increase, researchers continue to seek ways to increase its storage capacity and performance.

One technique that has been developed to increase the storage capacity of flash memory is to store multiple bits of data in flash memory cells. A multi-bit flash memory cell stores multiple bits of data using multiple threshold voltage distributions that correspond to different values of multi-bit data. For instance, a 2-bit flash memory cell can store data using four different threshold voltage distributions each corresponding to one of logical states "11", "10", "00", and "01".

The performance and reliability of multi-bit flash memory cells tends to decrease as the number of threshold voltages increases. For instance, in a multi-bit flash memory cell that stores data using a large number of threshold voltage distributions, the threshold voltage distributions can become overlapped, which can change stored data. Accordingly, researchers continue to seek ways to improve the reliability of multi-bit flash memory cells.

SUMMARY

Embodiments of the inventive concept provide memory systems that use a priori probability information to read stored data and methods of operating the memory systems.

According to one embodiment of the inventive concept, a memory system comprises a non-volatile memory device that stores user data and state information regarding the user data, and a memory controller that accesses the state information and the user data in a read operation of the non-volatile memory device, calculates a priori probabilities of the user data based on the state information, calculates a posteriori probabilities of the user data based on the a priori probabilities, and performs a soft-decision operation to detect logical states of the user data based on the a posteriori probabilities.

In certain embodiments, the state information is stored as meta-data of the user data.

In certain embodiments, the state information indicates a number of bits of the user data that have been programmed to each of various logical states.

In certain embodiments, the a priori probabilities comprise a first a priori probability indicating a proportion of bits of the user data that have been programmed to a first logical state, and a second a priori probability indicating a proportion of bits of the user data that have been programmed to a second logical state.

In certain embodiments, the a posteriori probabilities comprise a first a posteriori probability that is calculated by multiplying the first a priori probability with a first conditional probability and a second a posteriori probability that is calculated by multiplying the second a priori probability with a second conditional probability.

In certain embodiments, the soft-decision operation compares the first a posteriori probability with the second a posteriori probability and identifies a value of one or more bits of the user data according to which of the first and second a posteriori probabilities is larger.

In certain embodiments, the first conditional probability is a probability that a bit is read with the first logical state, given that the bit was programmed with the first logical state.

In certain embodiments, the memory controller comprises an a priori probability computation unit that calculates the a priori probabilities based on the state information, an a posteriori probability computation unit that calculates the a posteriori probabilities based on the a priori probabilities, and a soft-decision decoder that determines logical states of bits of the user data by performing the soft-decision operation based on the a posteriori probabilities.

In certain embodiments, the non-volatile memory device is a multi-level cell flash memory device.

In certain embodiments, the controller reads a page of data comprising the user data and the state information and computes an a posteriori probability for a codeword of user data in the page.

According to one embodiment of the inventive concept, a method of processing data in a non-volatile memory device comprises receiving data and state information regarding the data from the non-volatile memory device, calculating a priori probabilities for the data according to the state information, calculating a posteriori probabilities of a bit or codeword of the data according to the a priori probabilities, and determining a value of the bit or the codeword based on the a posteriori probabilities.

In certain embodiments, the data and the state information are stored in a same page of the non-volatile memory device.

In certain embodiments, the state information is stored in a meta-data area of the page.

In certain embodiments, the state information indicates a number of bits of the data that have been programmed to each of various logical states.

In certain embodiments, the method further comprises programming the data and the state information in the non-volatile memory device.

In certain embodiments, the a priori probabilities are multiplied by conditional probabilities to calculate the a posteriori probabilities.

In certain embodiments, a first one of the conditional probabilities is a probability that a bit is read with a first logical state, given that the bit was programmed with the first logical state, and a second one of the conditional probabilities is a probability that the bit is read with the first logical state, given that the bit was programmed with the second logical state.

In certain embodiments, the first and second logical states are one bit logical states.

In certain embodiments, receiving the data and state information from the non-volatile memory device comprises operating a memory interface of a memory controller to communicate with the non-volatile memory.

In certain embodiments, the non-volatile memory device is a NAND flash memory device.

BRIEF DESCRIPTION OF THE DRAWINGS

The drawings illustrate selected embodiments of the inventive concept. In the drawings, like reference numbers indicate like features.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

Certain embodiments are described below with reference to a NAND flash memory device. However, the inventive concept is not limited to NAND flash memory devices and can be embodied in a variety of other types of memory, including various forms of non-volatile memory, such as PRAM, magnetoresistive random access memory (MRAM), resistive random access memory (ReRAM), FRAM, and NOR flash memory. In addition, certain embodiments are described with reference to NAND flash memories comprising two-bit multi-level cells (MLCs). However, embodiments of the inventive concept are not limited to 2-bit MLCs and can be embodied by single level cell (SLC) memory devices, or MLC memory devices storing different numbers of bits per memory cell.

Figure 1:
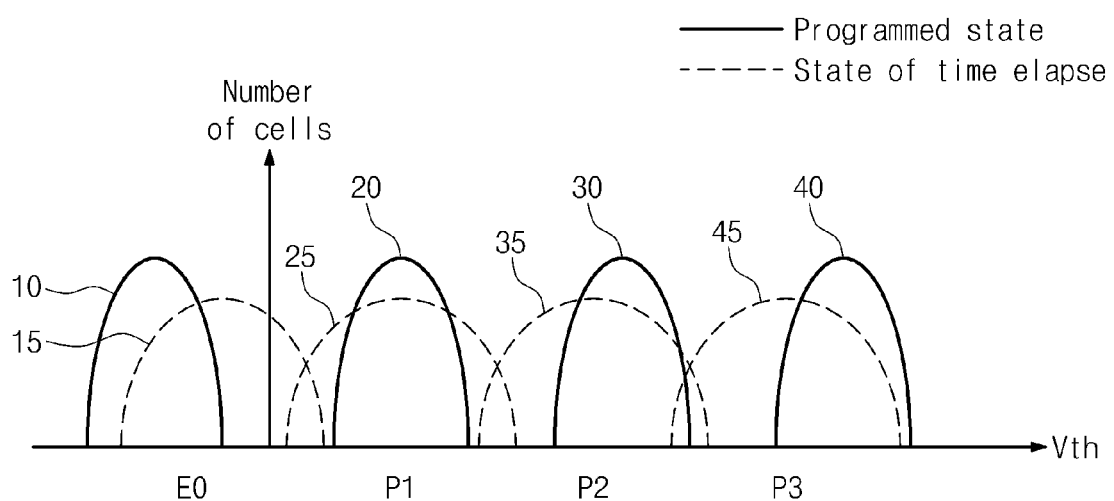
FIG. 1 is a graph illustrating threshold voltage distributions of a multi-bit non-volatile memory device having deteriorated data storage characteristics.

FIG. 1 is a graph illustrating threshold voltage distributions of a multi-bit non-volatile memory device having deteriorated data storage characteristics. The non-volatile memory device of FIG. 1 uses four threshold voltage distributions to store two bits of data in each memory cell. Among the four threshold voltage distributions, a lowest distribution corresponds to an erased state E0, an three upper distributions correspond to respective programmed states P1, P2, and P3.

The memory cells of the non-volatile memory device are initially programmed to reference distributions 10, 20, 30, and 40. However, during subsequent operations, threshold voltage distributions 10, 20, 30, and 40 deteriorate due to various factors. In particular, threshold voltage distributions 10, 20, 30, and 40 spread out to form respective threshold voltage distributions 15, 25, 35, and 45 as indicated by dotted lines. This deterioration can lead to read errors in subsequent read operations because it can prevent the threshold voltage distributions from being properly distinguished from each other.

The spreading of the threshold voltage distributions can be caused, for example, by interference from adjacent memory cells. The interference typically includes program disturbance and lateral charge spreading. For example, a threshold voltage of a memory cell can be increased or decreased based on a threshold voltage of an adjacent memory cell. Lateral charge spreading and the program disturbance are typically greatest between memory cells in erased state E0 and memory cells in program state P3.

Read errors can arise in the non-volatile memory of FIG. 1 for other reasons in addition to the deterioration of threshold voltage distributions. For instance, read errors can arise due to manufacturing defects, external noise, and channel instability. Embodiments of the inventive concept can be used to address these and other sources of errors in non-volatile memory devices.

Figure 2:
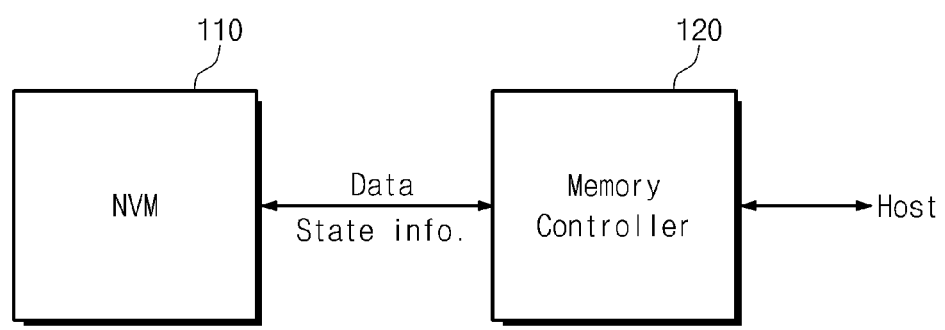
FIG. 2 is a block diagram of a memory system according to an embodiment of the inventive concept.

FIG. 2 is a block diagram of a memory system 100 according to an embodiment of the inventive concept. Referring to FIG. 2, memory system 100 comprises a non-volatile memory device 110 and a memory controller 120.

For explanation purposes, it will be assumed that non-volatile memory device 110 comprises a NAND flash memory device. Data provided from memory controller 120 is stored as a page unit (e.g., 2 KBytes) in non-volatile memory device 110, where each page comprises user data and meta-data. Non-volatile memory device 110 also stores state information of the user data. The state information can be stored as part of the meta-data.

The state information typically indicates a number of bits of the user data that have a logical state '0', and the number of bits of the user data that have a logical state '1'. For instance, in a page comprising ten bits of data, the state information can indicate that seven bits are in logical state '0' and the remaining three bits are in logical state '1'.

The state information can be used to calculate an a priori probability (hereafter, "prior probability") of each state. For instance, the state information can be used to calculate the probability that a bit chosen at random from among the page of ten bits has logical state '0' is seven out of ten, or 0.7, because there are seven bits with logical state '0'. This prior probability can be expressed as $P(S=0)=0.7$, where "S" is a random variable corresponding to the logical state of a bit of data.

The prior probability can be used in a soft-decision operation used to detect a state of a bit of data read during a read operation. The soft-decision operation uses the prior probability in conjunction with other factors in order to compensate for possible deterioration or distortion of threshold voltage distributions, such as those described above with reference to FIG. 1. The soft-decision process can be performed by memory controller 120, as will be described in further detail with reference to FIG. 3.

Non-volatile memory device 110 outputs read data in response to a read instruction from memory controller 120. The read data comprises the state information and can be provided as meta-data. The meta-data typically comprises control information for user data. Where a page of user data is provided in read data, state information for the page of user data can be included in meta-data of the read data.

Memory controller 120 calculates the prior probability by referring to the state information and calculates an a posteriori probability (hereafter, "posterior probability") by referring to the prior probability and other information. The prior probability and the posterior probability are used for the soft-decision operation. The posterior probability is a probability of a particular state given observed information. A maximum a posteriori (MAP) calculation can be used to determine a most likely state among a set of candidate states given an observation related to the state. For instance, a MAP calculation can be used to determine a most likely logical state of a bit in a memory cell, given a measured threshold voltage or a detected logical state of the memory cell after transmission through a data channel.

In many memory systems, prior probabilities are not considered when reading data through a data transmission channel. Such memory systems can assume that data states are a priori equally probable. For instance, for any one bit, a memory system may assume that the bit may with equal probability have logical state '0' or logical state '1'.

In memory system 100, memory controller 120 participates in both the programming and reading of non-volatile memory 110. Accordingly, memory controller 120 can store state information in non-volatile memory 110 during program operations, and use the state information in read operations of non-volatile memory 110. Memory controller 120 generates the state information by examining the logical states of data received from a host in a program operation and then stores the state information as meta-data in non-volatile memory device 110.

Memory controller 120 reads user data and meta-data from non-volatile memory device 110 in response to a read request. Memory controller 120 then calculates prior probabilities based on state information contained in the meta-data, and determines posterior probabilities for logical states of the user data based on the prior probabilities and read values of the user data. The process of determining the posterior probabilities is followed by a soft-decoding scheme, which implements a MAP calculation based on the posterior probabilities.

Logical states of bits in the user data can be determined more accurately with reference to the prior probability. As an example, assume that a page of user data comprises 10 bits and that the page comprises 7 bits with logical state '0' and 3 bits with logical state '0'. In this example, 70% of the bits have logical state '0' and 30% of the bits have logical state '1'. Accordingly, the prior probability of logical state '0' for each bit in the page of user data is 0.7, and the prior probability of logical state '1' for each bit in the page of user data is 0.3. However, where no state information is provided, memory controller 120 may assume that the prior probabilities of logical states '0' and '1' for each bit in the page of user data are 0.5.

Figure 3:
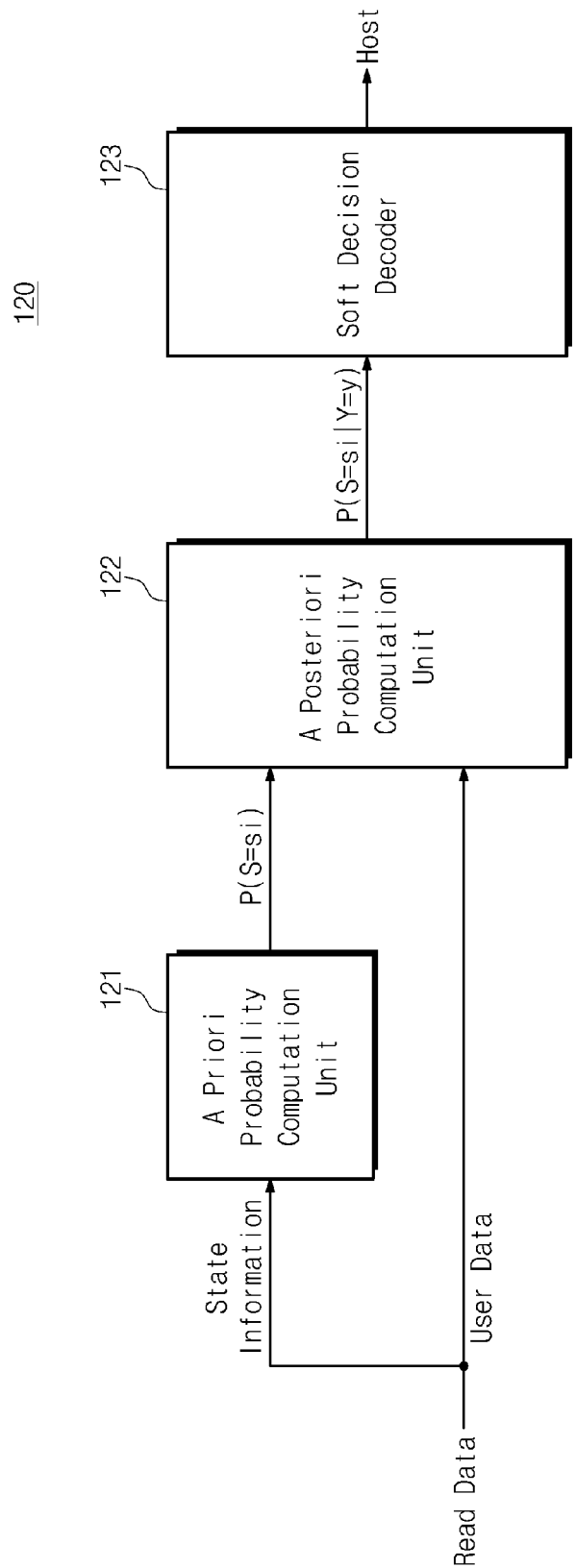
FIG. 3 is a block diagram of a memory controller shown in FIG. 2.

FIG. 3 is a block diagram of an embodiment of memory controller 120 shown in FIG. 2.

Referring to FIG. 3, memory controller 120 comprises an a priori probability computation unit 121, an a posteriori probability computation unit 122, and a soft-decision decoder 123.

A priori probability computation unit 121 extracts state information from read data provided from non-volatile memory device 110. The read data comprises user data and meta-data. The meta-data comprises the state information. For example, the state information can comprise a ratio of logical states '0' to logical states '1' in the user data. Alternatively, the state information can be the number of bits in the user data with logical state '0' or logical state '1'. The state information can also indicate the number of logical states for each memory cell. For instance, in a 2-bit MLC device, each memory cell can have one of four logical states '11', '10', '00', or '01'.

A priori probability computation unit 121 calculates prior probability $P(S=s_i)$ by referring to the state information. The state information indicates the number of has been programmed to logical state '0' and logical state '1', respectively. The variable '$s_i$' indicates an i-th logical state. Accordingly, '$s_0$' indicates logical state '0', and '$s_i$' indicates logical state '1'. Prior probability $P(S=s_i)$ can be calculated by the following equation (1).

$$P(S = s_i) = \frac{N(s_i)}{\sum_{s_j \in A} N(s_j)} \quad (1)$$

In equation (1), 'A' indicates a set of logical states to which memory cells can be programmed. In an SLC device, $A \in \{0, 1\}$. The variable '$s_j$' indicates a j-th logical state. $N(s_j)$ indicates the number of bits with logical state $s_j$, and $N(s_i)$ indicates the number of bits with logical state $s_i$. Accordingly, $P(S=s_i)$ indicates the proportion of all bits of stored user data that are programmed with logical state $s_i$. As an example, in 10 bits of user data comprising 7 bits programmed with logical state '0' and 3 bits programmed with logical state '1', the prior probability $P(S=s_1)$ is 3/10=0.3, and the prior probability $P(S=s_0)$ is 7/10=0.7. A priori probability computation unit 121 calculates prior probability $P(S=s_i)$ by referring to equation (1).

A posteriori probability computation unit 122 calculates posterior probability $P(S=si|Y=y)$ by referring to prior probability $P(S=si)$ and user data. The posterior probability $P(S=si|Y=y)$ is a conditional probability that is computed by the following equation (2).

$$P(S = s_i \mid Y = y) = \frac{P(Y = y \mid S = s_i)P(S = s_i)}{P(Y = y)} \quad (2)$$

In equation (2), 'Y' is a random variable indicating a logical state of user data that has been read from non-volatile memory device 110, and 'y' is a value of 'Y'. Accordingly, the prior probability $P(Y=y)$ indicates the probability that a bit of user data is read from non-volatile memory device 110 with logical state 'y'. Conditional probability $P(Y=y|S=si)$ indicates the probability that a bit of user data is read with logical state 'y' when the bit was previously programmed with logical state $s_i$. In other words, the conditional probability $P(Y=y|S=s_i)$ indicates the probability that a bit will be read erroneously, i.e., with the same or a different logical state than was programmed.

A posteriori probability computation unit 122 sets prior probability P(Y=y) as a fixed value, and computes conditional probability P(Y=y|S=si) when a data bit of a particular column of user data has logical state 'y'. These probability values are determined in accordance with a value of a read bit. The value of the read bit can be a logical '1' or a logical '0', and posteriori probability computation unit 122 calculates the posterior probability P(S=$s_i$|Y=y) according to equation (2). In some embodiments, a posteriori probability computation unit 122 also computes a likelihood ratio (LR) or a log likelihood ratio (LLR) for each bit.

A posteriori probability computation unit 122 computes posterior probabilities for all possible logical states of a bit of the read user data. Soft-decision decoder 123 then determines the logical state of the bit based on the posterior probabilities. In particular, soft-decision decoder 123 determines the logical state by identifying the largest posterior probability and identifying the corresponding logical state as the logical state of the bit. For instance, assume that a bit of the user data is read with logical state Y=y. In this example, a posteriori probability computation unit 122 computes P(S=1|Y=1) and P(S=0|Y=1). Where P(S=1|Y=1) is larger than P(S=0|Y=1), the bit is determined to have logical state 1. This technique of choosing the logical state with the largest a posteriori probability is referred to as a MAP calculation, as described above.

In some embodiments, logical states can be determined for a plurality of bits at the same time. This can be accomplished, for instance, by computing posterior probabilities that multiple bits are programmed with certain logical states at the same time. The read data can then be determined by identifying a maximum value among the computed posterior probabilities. An apparatus for determining the read data using the maximum posterior probability is called a "MAP decoder". The read data determined by the MAP decoding scheme can be provided to the host as read data.

Figure 4:
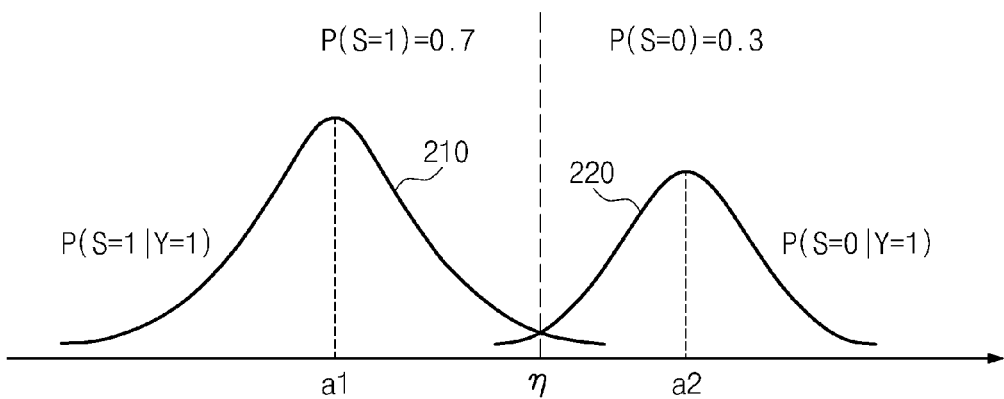
FIG. 4 is a graph of probability density functions of different states of flash memory cells.

FIG. 4 is a graph illustrating probability density functions for bits stored in non-volatile memory device 110. These probability density functions vary according to 'Y', where 'Y' indicates threshold voltage of a memory cell in non-volatile memory device 110. In this example, posterior probability P(S=1|Y) is larger than posterior probability P(S=0|Y=1) within a lower range of threshold voltages, and posterior probability P(S=0|Y) is larger than posterior probability P(S=1|Y) within a higher range of threshold voltages. Accordingly, in this example, a memory cell in the higher range of threshold voltages is more likely to store logical state '0' than a memory cell in the lower range of threshold voltages.

In the example of FIG. 4, a hypothesis selection criterion "η" is used to determine whether a memory cell stores logical state '1' or '0'. In this example, hypothesis selection criterion "η" is closer to a peak "a2" of P(S=0|Y) than to a peak "a1" of P(S=1|Y). This is because prior probability P(S=1) is larger than prior probability P(S=1), and therefore memory cells are a priori more likely to be in logical state '1' than in logical state '0'.

Figure 5:
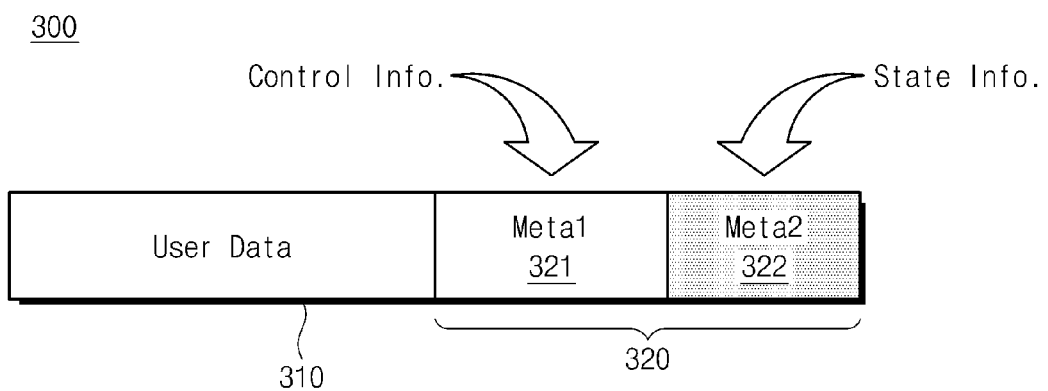
FIG. 5 is a diagram illustrating a data structure used to store data in a non-volatile memory device according to an embodiment of the inventive concept.

FIG. 5 shows a structure of data 300 stored in non-volatile memory device 110 according to an embodiment of the inventive concept. Where non-volatile memory device 110 is a NAND flash memory device, data 300 can comprise a page unit.

Referring to FIG. 5, data 300 comprises user data 310 and meta-data 320. User data 310 comprises user information provided by a user. Meta-data 320 comprises control information for user data 310. Meta-data 320 comprises first meta-data 321 and second meta-data 322. First meta-data 321 comprises the control information, which can be, for instance, a type of the user data, a random seed, parity information, or program/erase cycle information for wear leveling.

Second meta-data 322 comprises state information. For example, second meta-data 322 can comprise the number of bits of user data 310 with logical state '1' or logical state '0'. Where data is processed as symbol units, the state information can comprise a number of symbols. However, the range of the state information is not limited to the examples described above and can include various other forms of information.

Figure 6:
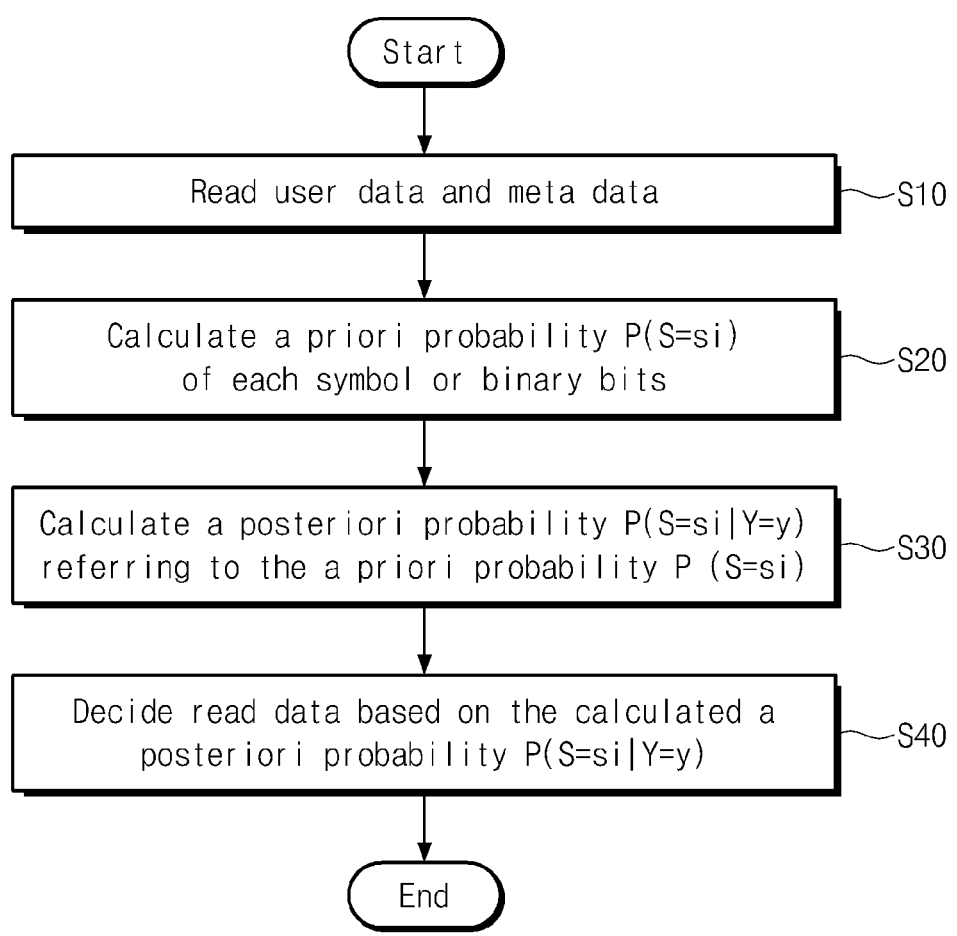
FIG. 6 is a flowchart of a data processing method in accordance with an embodiment of the inventive concept.

FIG. 6 shows a data processing method in accordance with an embodiment of the inventive concept. Referring to FIG. 6, memory controller 120 performs a data processing procedure in response to read command from the host.

In the method of FIG. 6, memory controller 120 provides the read command and the address to non-volatile memory device 110 (S10). Non-volatile memory device 110 then stores the requested read data in an input/output (IO) unit. In some embodiments, the requested read data comprises a page of data comprising user data and meta-data, with the meta-data comprising state information.

A priori probability computation unit 121 calculates prior probability P(S=$s_i$) using the state information of the read data (S20). As described above, the state information indicates the number of bits of the user data having logical state '1' and logical state '0'. Prior probability P(S=$s_i$) is calculated by equation (1) described above.

A posteriori probability computation unit 122 calculates posterior probability P(S=$s_i$|Y=y) for a bit or group of bits of the user data (S30). A posteriori probability computation unit 122 calculates posterior probability P(S=$s_i$|Y=y) corresponding to the bit or group of bits by referring to prior probability P(S=$s_i$). Prior probability P(S=$s_i$) is provided by a priori probability computation unit 121. Posterior probability P(S=$s_i$|Y=y) is calculated by equation (2) described above.

Soft-decision decoder 123 in memory controller 120 determines the logical states of the bit or group of bits using a MAP calculation. In particular, soft-decision decoder 123 identifies candidate logical states as 'true' if they correspond to a largest a posteriori probability, and identifies candidate logical states as 'false' if they do not correspond to a largest a posteriori probability. Soft-decision decoder 123 provides the identified logical states as user data to the host.

Figure 7:
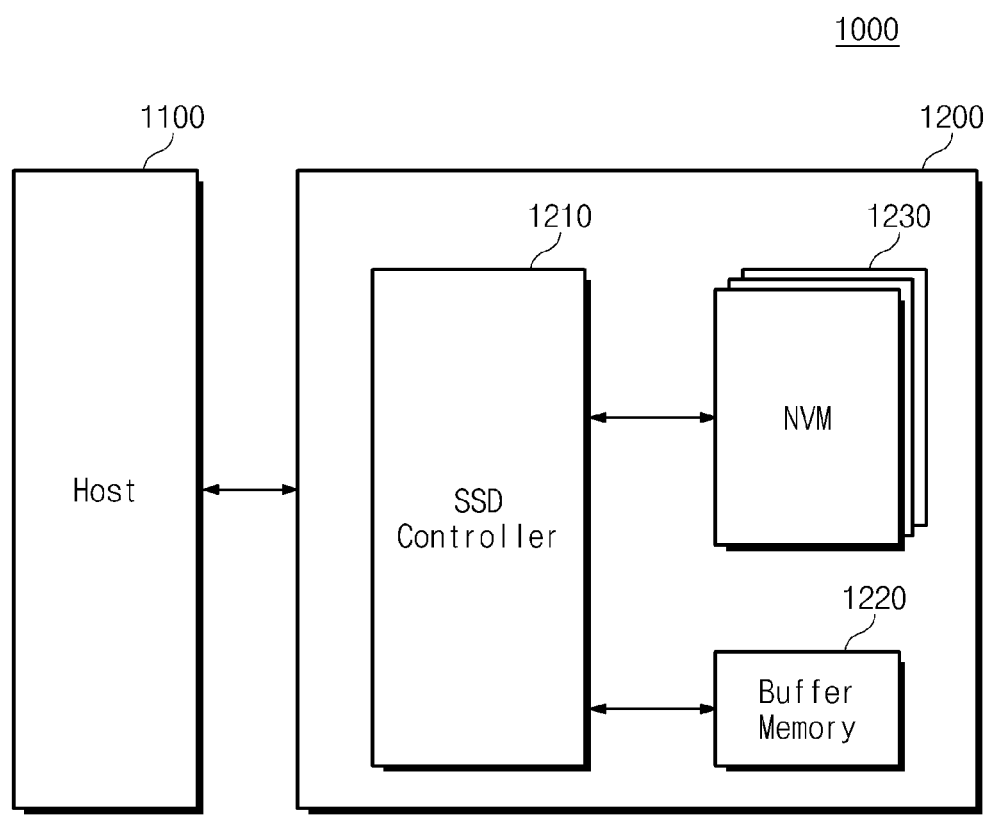
FIG. 7 is a block diagram of a solid-state drive (SSD) system according to an embodiment of the inventive concept.

FIG. 7 is a block diagram illustrating an SSD system 1000 according to an embodiment of the inventive concept.

Referring to FIG. 7, SSD system 1000 comprises a host 1100 and an SSD 1200. SSD 1200 comprises a SSD controller 1210, a buffer memory 1220, and a non-volatile memory device 1230.

SSD controller 1210 provides a physical connection between host 1100 and SSD 1200. SSD controller 1210 provides an interface between SSD 1200 and host 1100 according to a bus format of host 1100. SSD controller 1210 decodes instructions from host 1100 and accesses non-volatile memory device 1230 based on the instructions. The bus format of host 1100 can take a variety of forms, such as universal serial bus (USB), small computer system interface (SCSI), PCI express, ATA, parallel ATA (PATA), Serial ATA (SATA), and serial attached SCSI (SAS).

In a program operation of non-volatile memory device 1230, SSD controller 1210 stores prior probability information in the meta-data. Then, in a subsequent read operation, SSD controller 1210 calculates the prior probability by referring to the prior probability information in the meta-data. SSD controller 1210 then calculates posterior probabilities by referring to the prior probability. SSD controller 1210 can determine individual bit values or groups of bit values of read user data by using the posterior probabilities. The read data from non-volatile memory device 1230 can be stored temporarily in buffer memory 1220 for data buffering.

Write data from host 1100 or read data from non-volatile memory device 1230 is temporarily stored in buffer memory 1220. Where data in non-volatile memory device 1230 is stored in buffer memory 1220, buffer memory 1220 provides the cached data to host 1100 directly in response to a read request from host 1100. Typically, the bus format of host 1100 is much faster than the speed of the memory channel of SSD 1200. Thus, where the interface speed of host 1100 is relatively fast, the performance of SSD system 1000 can be improved by using buffer memory 1220.

Buffer memory 1220 can be implemented by a synchronous DRAM to provide sufficient buffering for SSD 1200. However, buffer memory 1220 is not limited to this embodiment.

Non-volatile memory device 1230 serves as a primary storage medium for SSD 1200. Non-volatile memory device 1230 can comprise, for instance, a NAND-type flash memory having a large storage capacity. Non-volatile memory device 1230 can also be implemented by multiple memory devices, where each memory device is connected to SSD controller 1210 through a channel. Although the NAND flash memory is presented as one type of storage medium for SSD 1200, other types of non-volatile memory can be used as a storage media for SSD 1200, such as PRAM, MRAM, ReRAM, FRAM, or NOR flash memory. Moreover other types of memory, such as DRAM, can be used as storage media in memory systems according to various embodiments of the inventive concept.

Figure 8:
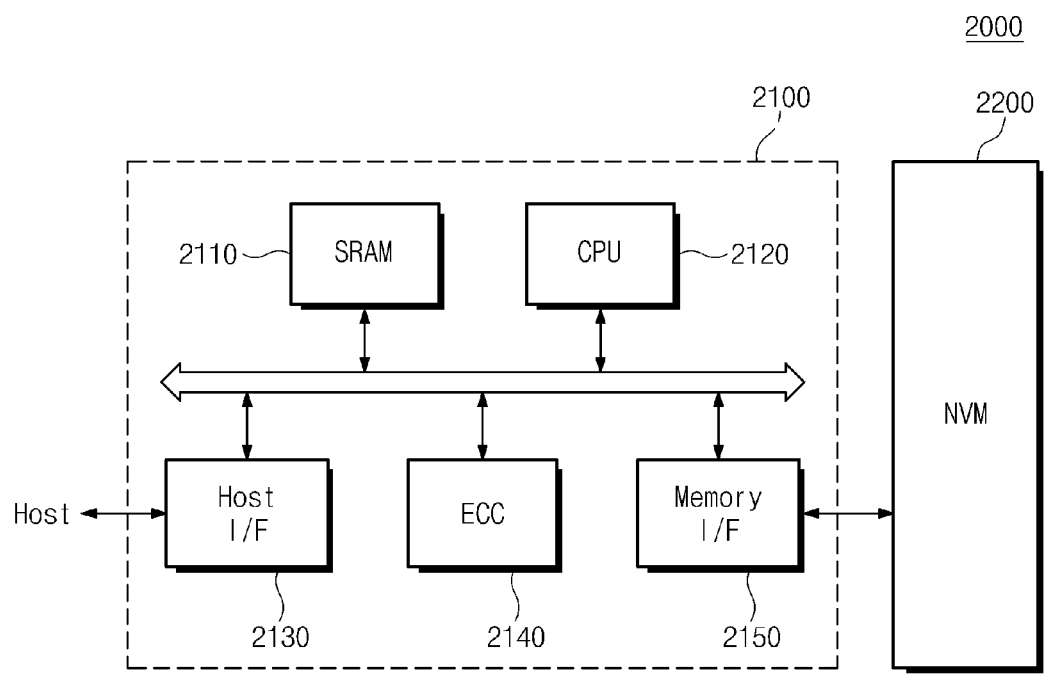
FIG. 8 is a block diagram of a memory system according to an embodiment of the inventive concept.

FIG. 8 is a block diagram of a memory system 2000 according to an embodiment of the inventive concept.

Referring to FIG. 8, memory system 2000 comprises a non-volatile memory device 2200 and a memory controller 2100. In some embodiments, non-volatile memory device 2200 and memory controller 2100 are configured to form a memory card or an SSD.

Memory controller 2100 comprises an SRAM 2110, a processing unit 2120, a host interface 2130, an ECC block 2140, and a memory interface 2150. In some embodiments, ECC block 2140 comprises a priori probability computation unit 121, a posteriori probability computation unit 122, and soft-decision decoder 123.

SRAM 2110 functions as a buffer memory of processing unit 2120. Host interface 2130 includes a protocol for exchanging data with a host connected with memory system 2000. ECC block 2140 is configured to detect and correct errors of data read out from non-volatile memory device 2200. Memory interface 2150 is configured to interface with non-volatile memory device 2200. Processing unit 2120 is configured to control the overall operation (e.g., data exchange) of memory controller 2100.

Although not shown in FIG. 8, memory system 2000 can further comprise a ROM for storing code data to interface with the host. Non-volatile memory device 2200 can be formed of a multi-chip package comprising a plurality of flash memory chips. Memory controller 2100 can be configured to communicate with an external device, such as the host, using one of various interface protocols such as USB, MMC, PCI-E, SATA, PATA, SCSI, ESDI, or IDE.

Figure 9:
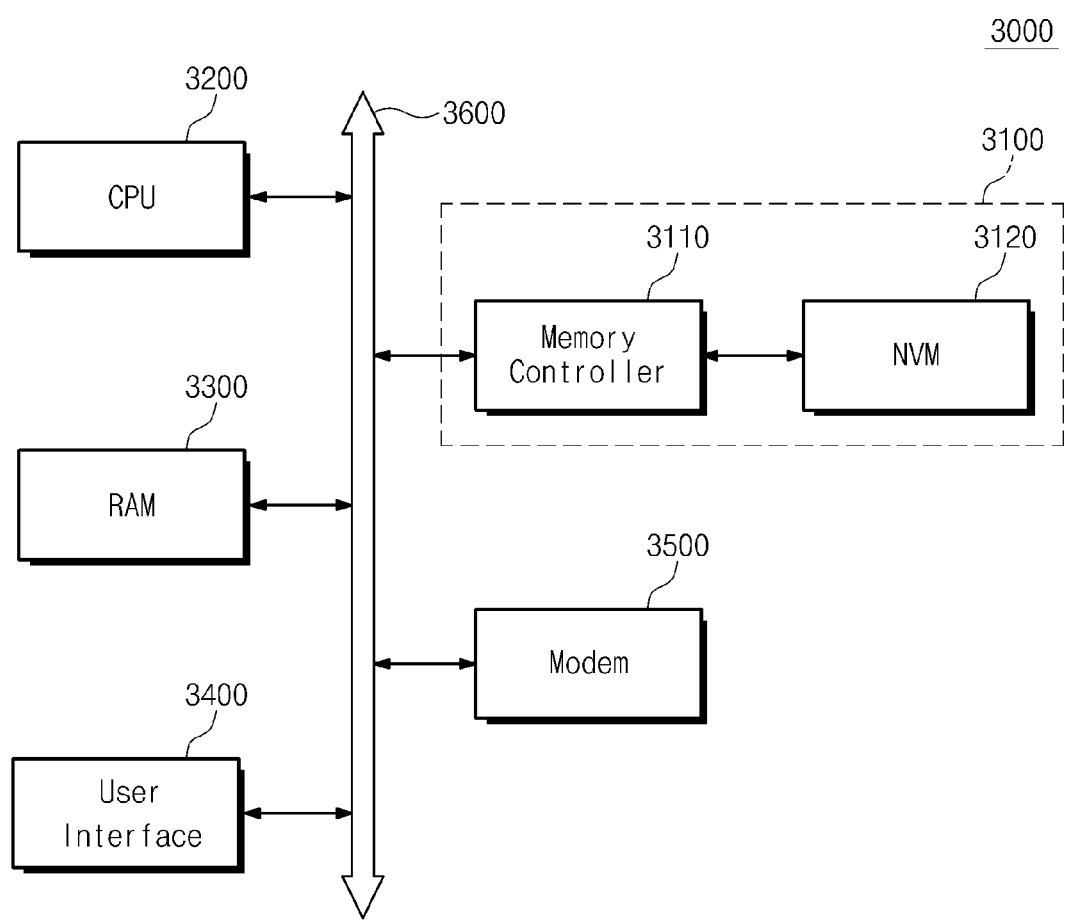
FIG. 9 is a block diagram of a computing system comprising a flash memory device according to embodiment of the inventive concept.

FIG. 9 is a block diagram of a computing system 3000 comprising a flash memory device 3120 according to an embodiment of the inventive concept.

Referring to FIG. 9, computing system 3000 comprises a memory system 3100, a processing unit 3200 such as a microprocessor or a CPU, a RAM 3300, a user interface 3400, a modem 3500, such as a baseband chipset, and a system bus 3600 connecting the other features to each other. Memory system 3100, which comprises a memory controller 3110 and a non-volatile memory 3120, can be configured similar to memory system 100 of FIG. 2. Where computing system 3000 is a mobile device, a battery (not shown) can be further provided to supply an operating voltage. Although not shown in FIG. 9, computing system 3000 can further comprise other features, such as an application chipset, a camera image processor (CIS), or a mobile DRAM. Memory system 3100 can comprise, for example, an SSD using non-volatile memories to store data. Memory system 3100 can also be formed of a fusion flash memory, such as a One-NAND flash memory.

The above described systems and devices can be packaged using various types of package configurations, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of processing data in a non-volatile memory device, comprising:
   receiving data and state information regarding the data from the non-volatile memory device, wherein the data and state information are stored in a same page of the non-volatile memory device;
   calculating a priori probabilities for at least one bit of the data according to the state information;
   calculating a posteriori probabilities for the at least one bit of the data according to the a priori probabilities; and
   determining respective values for each one of the at least one bit of data according to the a posteriori probabilities.

2. The method of claim 1, wherein the state information is stored in a meta-data area of the page.

3. The method of claim 1, wherein the state information indicates a number of bits among the at least one bit of data that have been programmed to each one of a plurality of logical states.

4. The method of claim 1, further comprising:
   programming the data and the state information to the same page in the non-volatile memory device.

5. The method of claim 1, wherein the a priori probabilities are multiplied by conditional probabilities to calculate the a posteriori probabilities.

6. The method of claim 5, wherein a first one of the conditional probabilities is a probability that a bit among the at least one bit of data is read as a first logical state, given that the bit was programmed as the first logical state, and a second one of the conditional probabilities is a probability that the bit is read as the first logical state, given that the bit was programmed as the second logical state.

7. The method of claim 6, wherein the first and second logical states are respective logical states among the plurality of logical states.

8. The method of claim 1, wherein receiving the data and state information from the non-volatile memory device comprises operating a memory interface of a memory controller to communicate with the non-volatile memory.

9. The method of claim 1, wherein the non-volatile memory device is a NAND flash memory device.

* * * * *